United States Patent
Kliger et al.

(10) Patent No.: US 9,379,848 B2
(45) Date of Patent: Jun. 28, 2016

(54) CYCLIC REDUNDANCY CHECK (CRC) AND FORWARD ERROR CORRECTION (FEC) FOR RANGING WITHIN COMMUNICATION SYSTEMS

(71) Applicant: BROADCOM CORPORATION, Irvine, CA (US)

(72) Inventors: Avraham Kliger, Ramat Gan (IL); Ba-Zhong Shen, Irvine, CA (US)

(73) Assignee: BROADCOM CORPORATION, Irvine, CA (US)

(*) Notice: Subject to any disclaimer, the term of this patent is extended or adjusted under 35 U.S.C. 154(b) by 91 days.

(21) Appl. No.: 14/290,102

(22) Filed: May 29, 2014

(65) Prior Publication Data

US 2014/0365844 A1 Dec. 11, 2014

Related U.S. Application Data

(60) Provisional application No. 61/833,393, filed on Jun. 10, 2013, provisional application No. 61/834,825, filed on Jun. 13, 2013, provisional application No. 61/984,152, filed on Apr. 25, 2014.

(51) Int. Cl.
| | |
|---|---|
| *H03M 13/00* | (2006.01) |
| *H04L 1/00* | (2006.01) |
| *H03M 13/11* | (2006.01) |
| *H03M 13/35* | (2006.01) |
| *H03M 13/09* | (2006.01) |

(52) U.S. Cl.
CPC ........... *H04L 1/0068* (2013.01); *H03M 13/116* (2013.01); *H03M 13/1185* (2013.01); *H03M 13/353* (2013.01); *H03M 13/618* (2013.01); *H03M 13/6362* (2013.01); *H04L 1/0057* (2013.01); *H03M 13/09* (2013.01)

(58) Field of Classification Search
CPC . H04L 1/0068; H04L 1/0057; H03M 13/618; H03M 13/185; H03M 13/116; H03M 13/353; H03M 13/6362; H03M 13/09
See application file for complete search history.

(56) References Cited

U.S. PATENT DOCUMENTS

| | | | | |
|---|---|---|---|---|
| 2007/0109988 A1* | 5/2007 | Sampath | ............... | H04L 1/0083 370/321 |
| 2010/0272447 A1* | 10/2010 | Kolze | ............... | H04B 10/25751 398/192 |
| 2010/0281330 A1* | 11/2010 | Blanksby | ............ | H03M 13/033 714/752 |
| 2010/0281335 A1* | 11/2010 | Blanksby | ............ | H03M 13/033 714/755 |
| 2011/0107175 A1* | 5/2011 | Shen | ................. | H03M 13/1151 714/752 |
| 2011/0299628 A1* | 12/2011 | Ko | ........................ | H04L 1/0044 375/298 |

* cited by examiner

*Primary Examiner* — April Y Blair
*Assistant Examiner* — Thien D Nguyen
(74) *Attorney, Agent, or Firm* — Garlick & Markison; Shayne X. Short

(57) ABSTRACT

A communication device (device) includes a processor configured to generate an initial ranging LDPC coded signal based on a first LDPC code and then transmits the initial ranging LDPC coded signal to another device (e.g., via a communication interface) for use by the other device for coarse power and timing adjustment. Then, the processor processes a received transmit opportunity signal to identify a transmit opportunity time period. The processor then generates a fine ranging LDPC coded signal based on a second LDPC code and transmits the fine ranging LDPC coded signal to the other device during the transmit opportunity time period for use by the other device for fine power and timing adjustment. In some instances, the processor may be configured to generate one or more wideband probe signals for transmission to the other device in conjunction with or instead of the fine ranging LDPC coded signals.

20 Claims, 10 Drawing Sheets

Figures 5A, 5B:
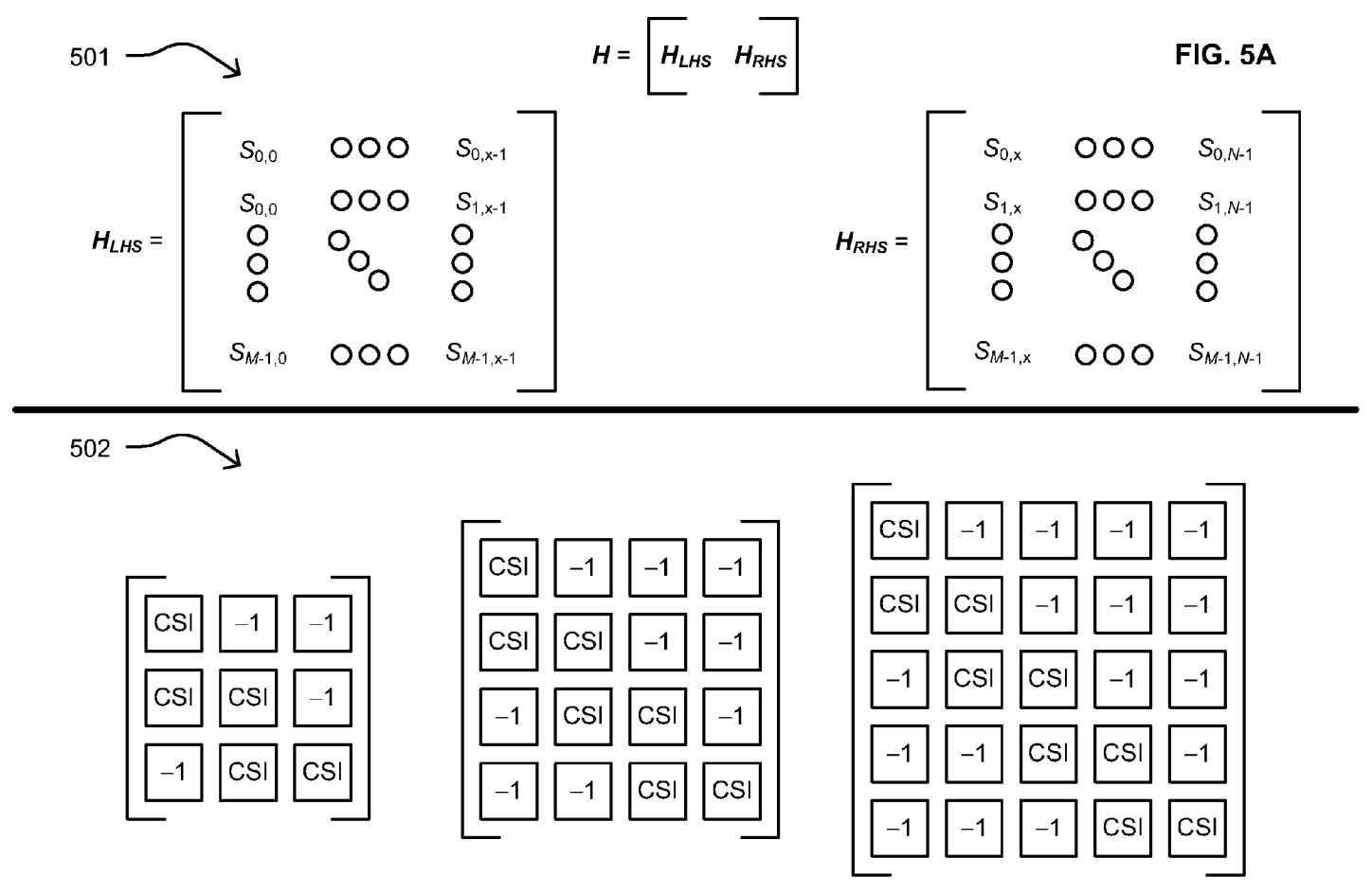

$$H = \begin{bmatrix} H_{LHS} & H_{RHS} \end{bmatrix}$$

$$H_{LHS} = \begin{bmatrix} S_{0,0} & S_{0,1} & \cdots & S_{M-1,0} \\ & & & \\ & & & \\ S_{0,x-1} & S_{1,x-1} & \cdots & S_{M-1,x-1} \end{bmatrix}$$

$$H_{RHS} = \begin{bmatrix} S_{0,x} & S_{1,x} & \cdots & S_{M-1,x} \\ & & & \\ & & & \\ S_{0,N-1} & S_{1,N-1} & \cdots & S_{M-1,N-1} \end{bmatrix}$$

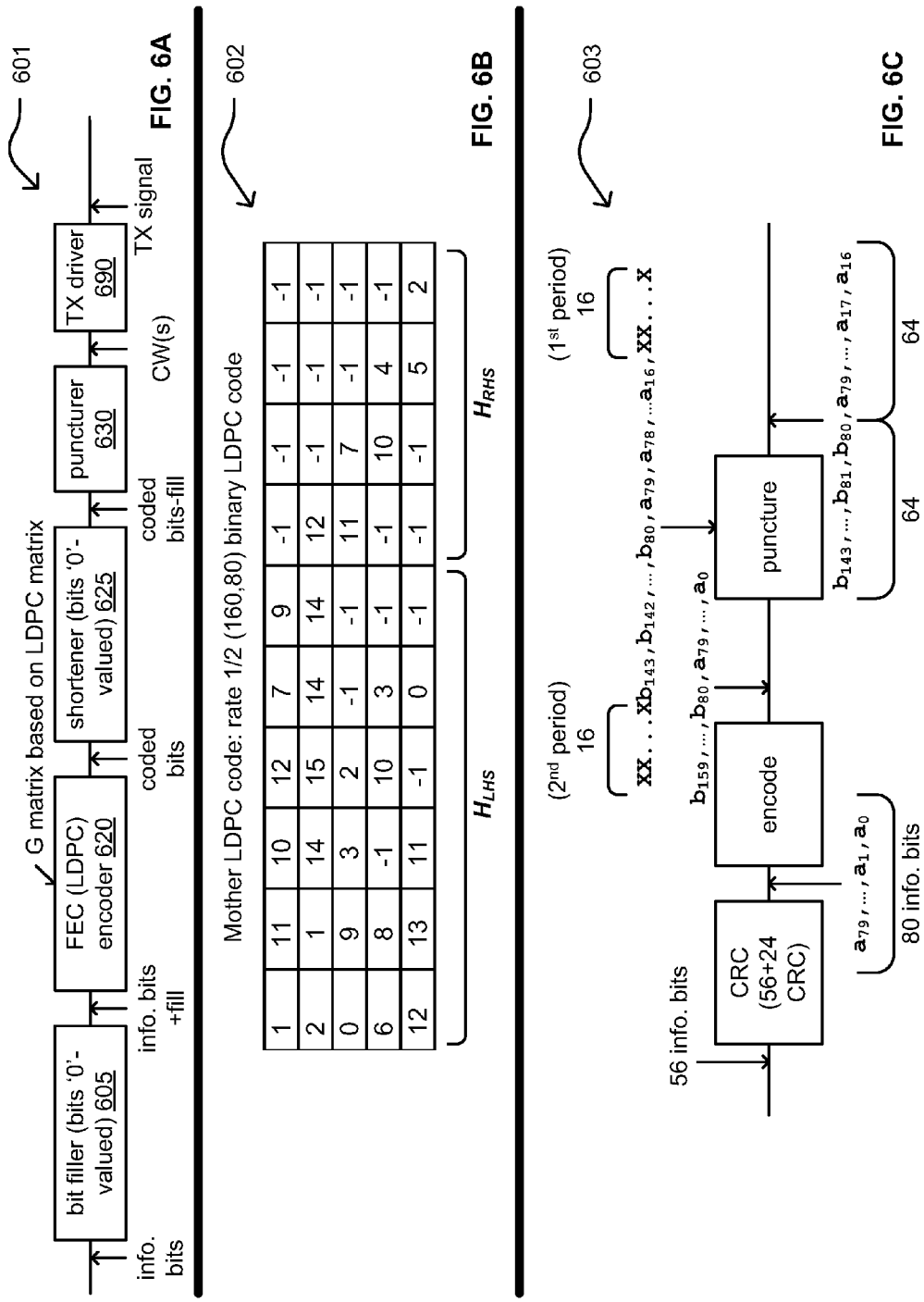

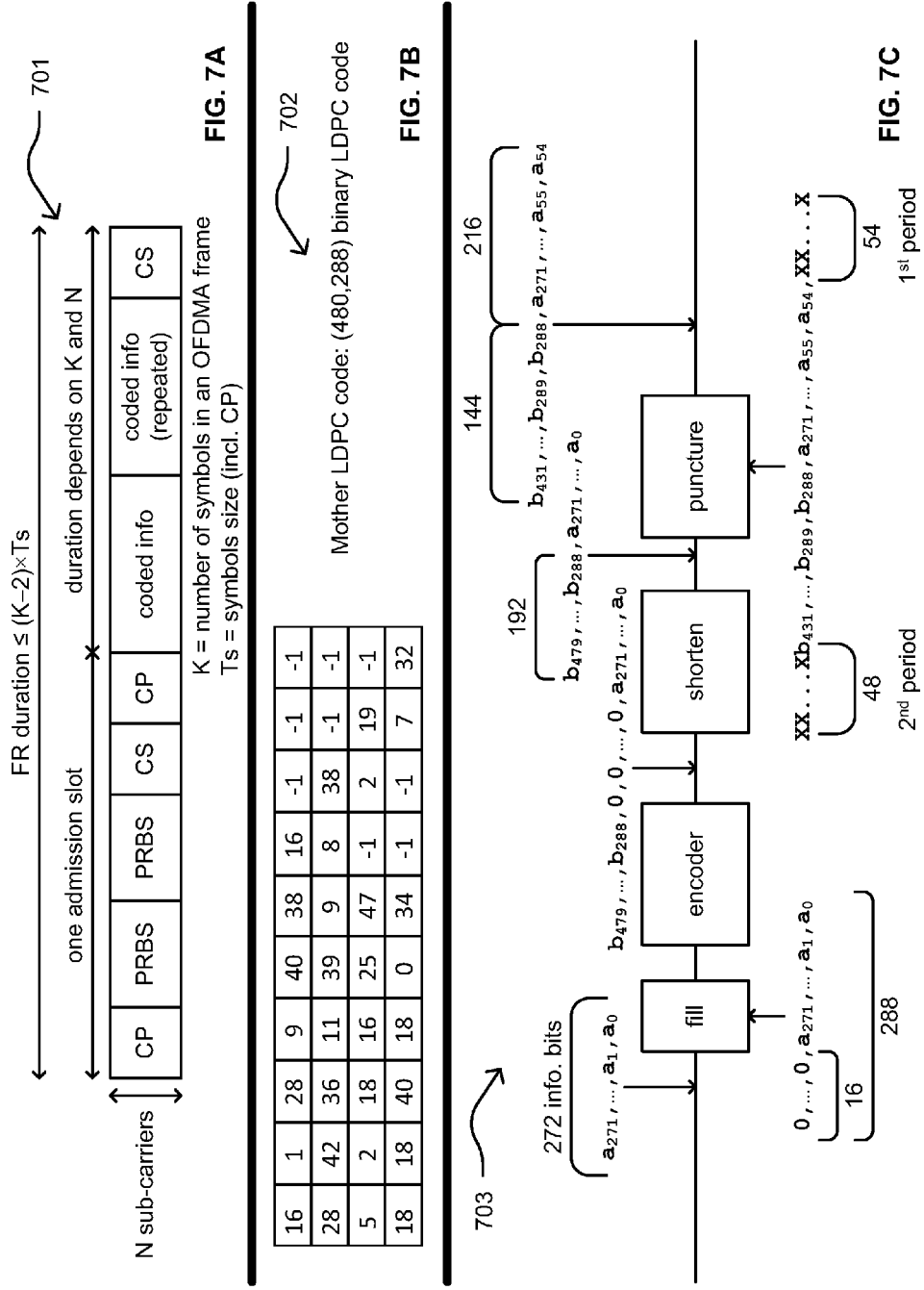

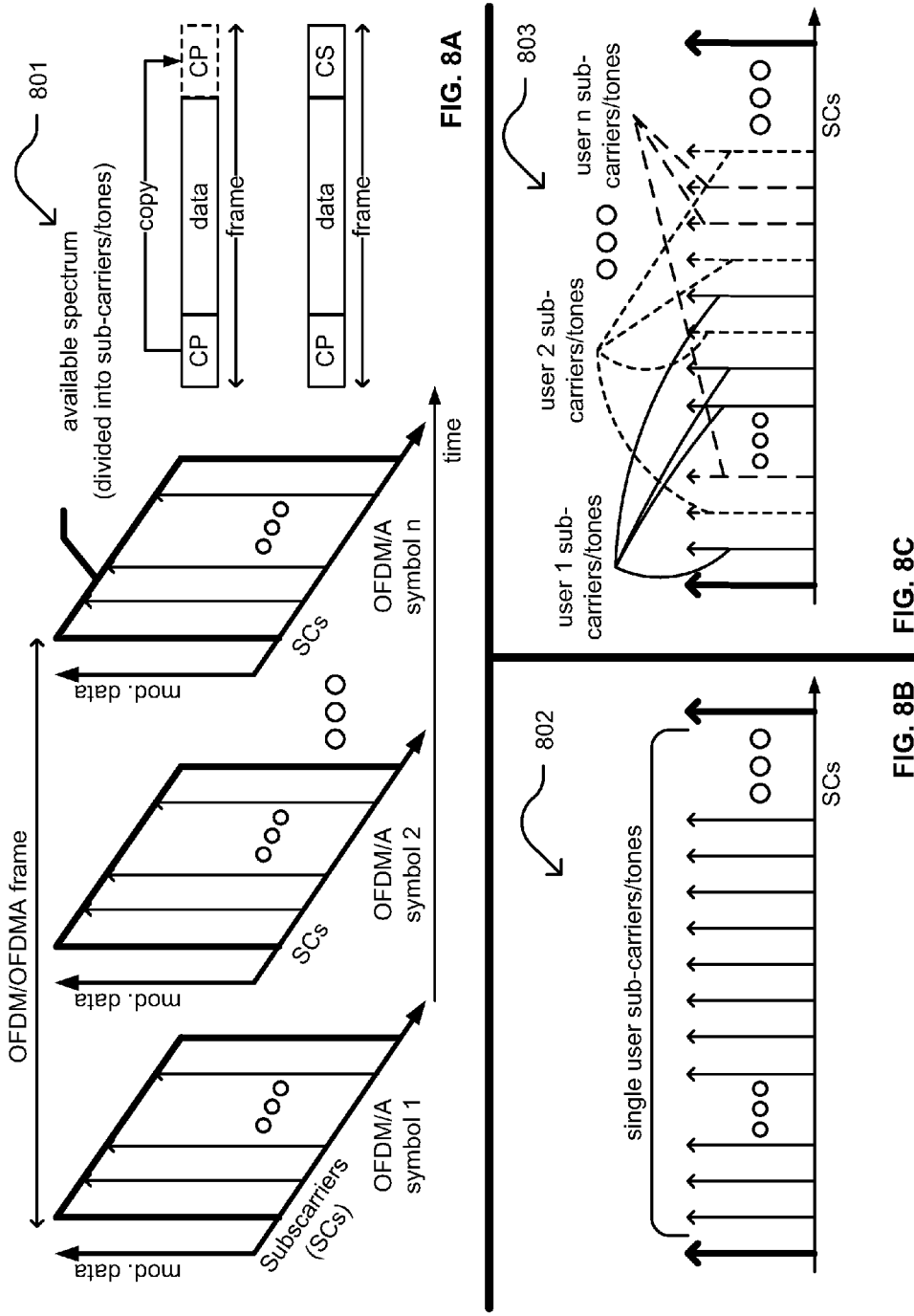

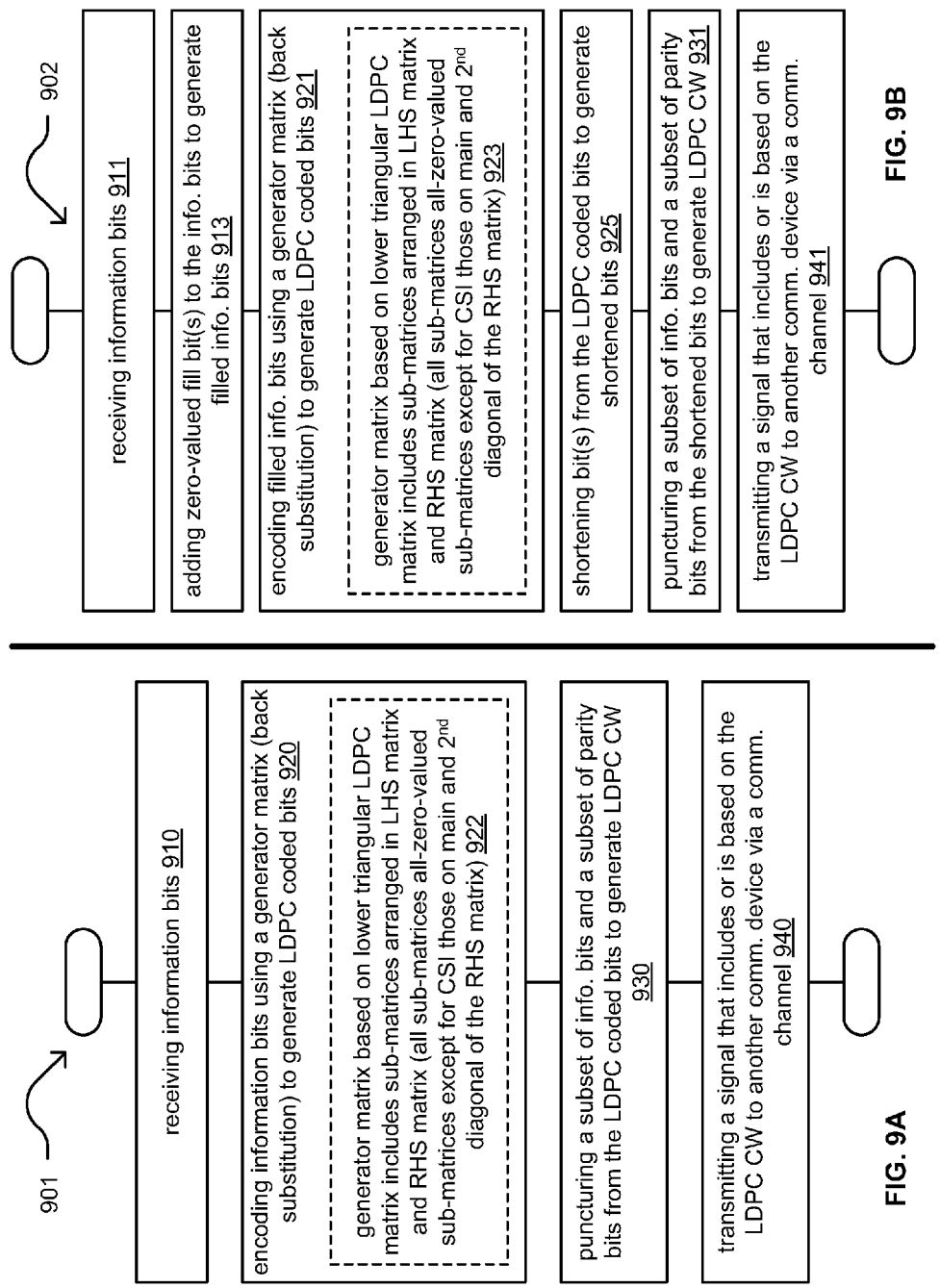

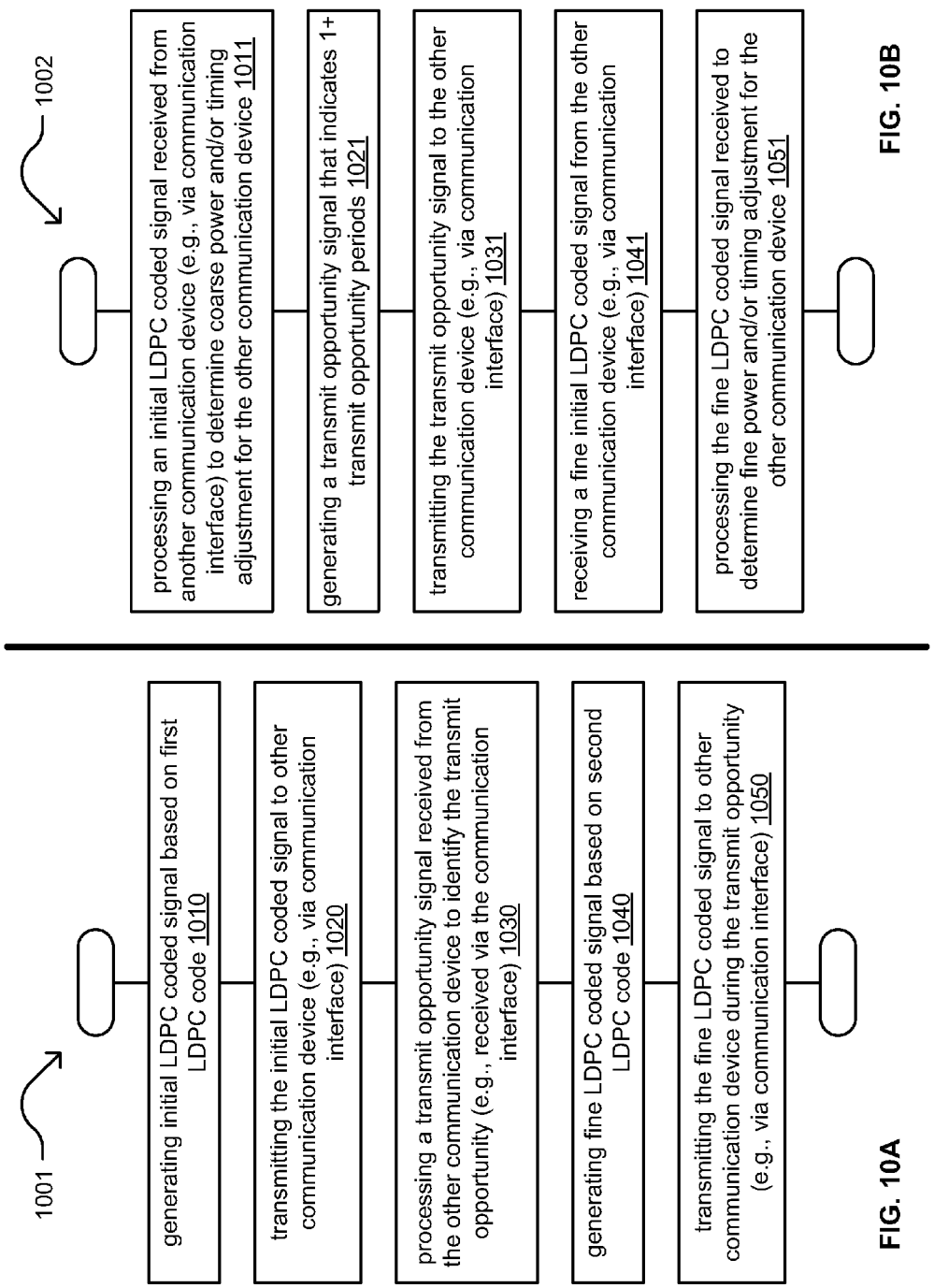

US 9,379,848 B2

CYCLIC REDUNDANCY CHECK (CRC) AND FORWARD ERROR CORRECTION (FEC) FOR RANGING WITHIN COMMUNICATION SYSTEMS

CROSS REFERENCE TO RELATED PATENTS/PATENT APPLICATIONS

The present U.S. Utility Patent Application claims priority pursuant to 35 U.S.C. §119(e) to U.S. Provisional Application No. 61/833,393, entitled "Cyclic redundancy check (CRC) and forward error correction (FEC) for initial ranging within communication systems," filed 06-10-2013; U.S. Provisional Application No. 61/834,825, entitled "Upstream fine ranging within communication systems," filed Jun. 13, 2013; and U.S. Provisional Application No. 61/984,152, entitled "Cyclic redundancy check (CRC) and forward error correction (FEC) for ranging within communication systems," filed Apr. 25, 2014, all of which are hereby incorporated herein by reference in their entirety and made part of the present U.S. Utility Patent Application for all purposes.

BACKGROUND

1. Technical Field

The present disclosure relates generally to communication systems; and, more particularly, to ranging within such communication systems.

2. Description of Related Art

Data communication systems have been under continual development for many years. The primary goal within such communication systems is to transmit information successfully between devices. Communications between devices can be governed by a number of operational parameters. Ranging is a process by which characteristics of the communication pathway between first and second communication devices can be determined.

A first communication device transmits a ranging signal to a second communication device, and the second communication device processes the ranging signal to determine one or more characteristics of the communication pathway between the first and second communication devices. Then, the second communication device communicates with the first communication device using one or more operational parameters that are selected based on the one or more characteristics of that communication pathway. Examples of such operational parameters may relate to transmission power and timing based on the distance between the first and second communication devices as well as any particular characteristics of the communication pathway between them.

BRIEF DESCRIPTION OF THE SEVERAL VIEWS OF THE DRAWINGS

FIG. 5A is a diagram illustrating an example of an LDPC matrix partitioned into a left hand side matrix and a right hand side matrix.

FIG. 5B is a diagram illustrating some examples of right hand side matrices of LDPC matrices.

FIG. 6A is a diagram illustrating an example of a communication device configured to perform bit filling, LDPC encoding, shortening, and puncturing.

FIG. 6B is a diagram illustrating an example of an LDPC matrix that characterizes an LDPC code used to generate an initial LDPC coded signal.

FIG. 6C is a diagram illustrating an example of a communication device configured to perform bit filling, LDPC encoding, shortening, and puncturing to generate an initial LDPC coded signal.

FIG. 7A is a diagram illustrating an example of a fine ranging signal.

FIG. 7B is a diagram illustrating an example of an LDPC matrix that characterizes an LDPC code used to generate a fine LDPC coded signal.

FIG. 7C is a diagram illustrating an example of a communication device configured to perform bit filling, LDPC encoding, shortening, and puncturing to generate a fine LDPC coded signal.

FIG. 8A is a diagram illustrating an example of orthogonal frequency division multiplexing (OFDM) and/or orthogonal frequency division multiple access (OFDMA).

FIG. 8B is a diagram illustrating another example of OFDM and/or OFDMA.

FIG. 8C is a diagram illustrating another example of OFDM and/or OFDMA.

FIG. 9A is a diagram illustrating an embodiment of a method for execution by one or more communication devices.

FIG. 9B is a diagram illustrating another embodiment of a method for execution by one or more communication devices.

FIG. 10A is a diagram illustrating another embodiment of a method for execution by one or more communication devices.

FIG. 10B is a diagram illustrating another embodiment of a method for execution by one or more communication devices.

DETAILED DESCRIPTION

Figure 1:
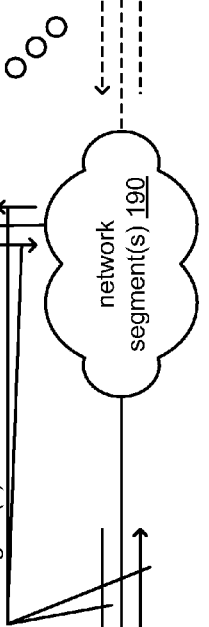
FIG. 1A is a diagram illustrating an embodiment of one or more communication systems.
FIG. 1B is a diagram illustrating an example of ranging signaling within one or more communication systems.
FIG. 1C is a diagram illustrating another example of ranging signaling within one or more communication systems.

FIG. 1A is a diagram illustrating an embodiment 101 of one or more communication systems. One or more network segments 190 provide communication inter-connectivity for at least two communication devices 110 and 120 (also referred to as CDs in certain locations in the diagrams). Note that general reference to a communication device may be made generally herein using the term 'device' (e.g., device 110 or CD 110 when referring to communication device 110, or devices 110 and 120, or CDs 110 and 120, when referring to communication devices 110 and 120). Generally speaking, any desired number of communication devices are included within one or more communication systems (e.g., as shown by communication device 130).

Generally speaking, any desired number of communication devices are included within one or more communication systems (e.g., as shown by communication device 130). Some or all the various communication devices 110-130 include capability to generate one or more types of ranging signals for transmission to another one of the devices 110-130. In one example, a ranging signal is composed of a preamble followed by low density parity check (LDPC) coded bits. In another example, a ranging signal is composed of LDPC coded bits and does not include such a preamble. In an example of operation, the device 110 includes a processor to generate one or more signals for transmission to the other devices 110-130 via a communication interface and to interpret or more signals received from any of the other devices 110-130 via the communication interface. In an example of operation, device 110 includes a communication interface to support communications with one or more of the other devices 120-130. This communication may be bidirectional/to and from the one or more of the other devices 120-130 or unidirectional (or primarily unidirectional) from the one or more of the other devices 120-130.

The processor of device 110 generates an initial ranging low density parity check (LDPC) coded signal based on a first LDPC code and then transmits the initial ranging LDPC coded signal to another communication device for use by the other communication device for coarse power and timing adjustment. Then, the processor of device 110 is configured to process a transmit opportunity signal received from the other communication device to identify a transmit opportunity time period. The processor of device 110 then generates a fine ranging LDPC coded signal based on a second LDPC code and then transmits the fine ranging LDPC coded signal to the other communication device within the transmit opportunity time period for use by the other communication device for fine power and timing adjustment. The first LDPC code is characterized by a first LDPC matrix that includes a first plurality of sub-matrices, and a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to the left of the main diagonal of the first right hand side matrix. The second LDPC code is characterized by a second LDPC matrix that includes a second plurality of sub-matrices, and a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix. In addition, the processor of device 110 may be configured to generate one or more wideband probes signals for transmission to another one of the devices (e.g., 120-130). These ranging signals (e.g., initial, fine, and/or wideband probes) may be transmitted upstream (US) to another one of the devices 110-130. A recipient device, such as device 120, is configured to process the received signal and transmit one or more response signals downstream (DS), such as a transmit opportunity signal, to the device 110. Generally, the recipient device (e.g., device 120) uses the ranging information to determine one or more operational parameters by which communications are supported with the transmitting device (e.g., device 110).

The various communication links within the one or more network segments 190 may be implemented using any of a variety of communication media including communication links implemented as wireless, wired, optical (e.g., including fiber-optic), satellite, microwave, etc. Also, in some instances, communication links of different types may cooperatively form a connection pathway between any two communication devices. Considering one possible example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In another example of operation, device 120 receives first one or more ranging signals from device 110 and second one or more ranging signals from device 130. Device 120 then processes those ranging signals to determine one or more characteristics of a first communication pathway between devices 110 and 120 and a second communication pathway between devices 120 and 130. Device 120 can select one or more operational parameters for use in subsequent communications with devices 110 and 130. Such operational parameters may be related to transmission power and timing of such communications.

FIG. 1B is a diagram illustrating an example 102 of ranging signaling within one or more communication systems. A first device (e.g., communication device 110) transmits a ranging signal to a second device (e.g., communication device 120). The ranging process may be viewed as being divided into multiple steps. In a first step, initial ranging is used by a headend or upstream (US) communication device (e.g., communication device 120 or a cable modem termination system (CMTS) as described with reference to FIG. 2) to identify a new admitting downstream (DS) communication device (e.g., communication device 110 or cable modem (CM) as described with reference to FIG. 2) and for coarse power and timing ranging. Fine ranging is then used after initial ranging has been completed, to fine-tune timing and power. Wideband probing is used during admission of the DS communication device and steady state operation for pre-equalization configuration and transmit (TX) power and time-shift ranging.

The headend or upstream (US) communication device uses the received ranging signals to determine one or more characteristics of a communication pathway between it and the new admitting downstream DS communication device, and then may select one or more operational parameters to govern subsequent communications based on those one or more characteristics. Generally, the ranging process is a step-by-step process by which a new device is admitted and registered to the communication system to support subsequent communications with one or more other devices in the system. In this diagram, after initial ranging is completed, one or more fine ranging signals are transmitted followed by one or more wideband probes.

FIG. 1C is a diagram illustrating another example 103 of ranging signaling within one or more communication systems. In this diagram, after initial ranging is completed, one or more fine ranging signals are transmitted followed by one or more wideband probes, and the fine ranging signals and the wideband probes are intermingled such that fine ranging signals and/or the wideband probes may be used after initial ranging is completed during the admission and steady state operational states.

Figure 2:
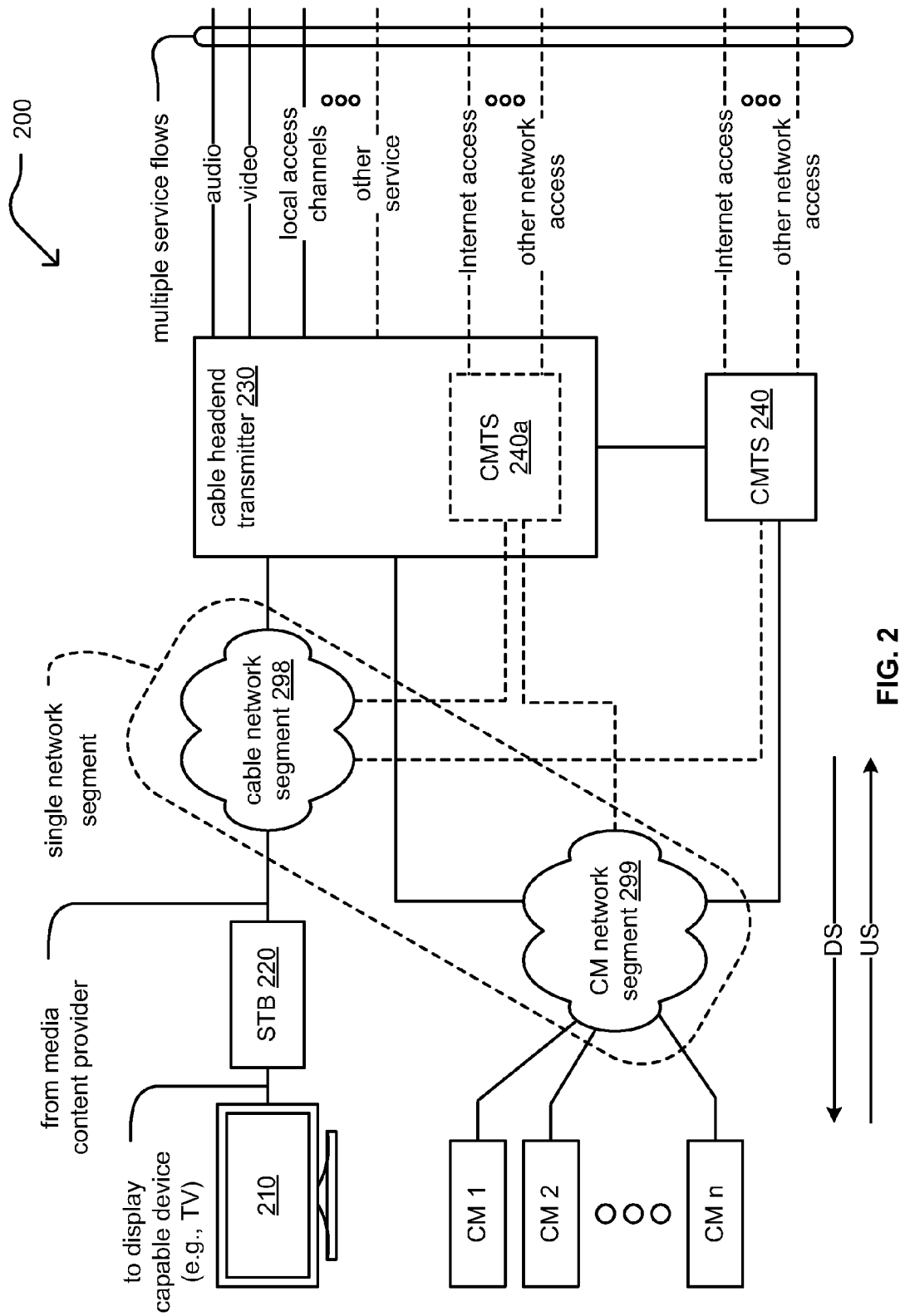
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240a. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240a). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 240 (or 240a) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM2, etc.), and upstream information is that which flows from the cable modems to the CMTS 240.

Any one of the devices in embodiment 200 (e.g., CMs 1-n, cable headend transmitter 230, CMTS 240a, and/or CMTS 240) may include functionality to generate and process various ranging signals (e.g., initial, fine, and wideband probes). For example, any one of the devices in embodiment 200 may be configured to include a communication interface to support communications with any of the other devices and also include a processor to generate various ranging signals for transmission to any of the other devices and to process various ranging signals received from any of the other devices.

In an example of operation, CMTS 240 includes a processor configured to receive, via a communication interface of the CMTS 240, an initial ranging LDPC coded signal from another communication device (e.g., CM 1). The initial ranging LDPC coded signal includes first encoded bits based on a first LDPC code that is characterized by a first LDPC matrix that includes a first plurality of sub-matrices (e.g., having characteristics similar to that described with reference to FIG. 5A and FIG. 5B). Note also that such a first LDPC coded signal may be generated using shortening and puncturing as described with reference to FIG. 6A. CMTS 240's processor is configured to process the initial ranging LDPC coded signal to make estimates of the first encoded bits to determine at least one of coarse power and timing adjustment for the other communication device. CMTS 240's processor is then configured to generate and transmit a transmit opportunity signal that indicates one or more transmit opportunity time periods including for use by the other communication device to transmit a fine ranging LDPC coded signal. Then, the CMTS 240's processor is configured to receive, via the communication interface, a fine ranging LDPC coded signal from the other communication device within one of the one or more transmit opportunity time periods. The fine ranging LDPC coded signal includes second encoded bits based on a second LDPC code that is characterized by a second LDPC matrix that includes a second plurality of sub-matrices (e.g., also having characteristics similar to that described with reference to FIG. 5A and FIG. 5B, yet being a different LDPC matrix than the first LDPC matrix used for the initial ranging LDPC coded signal). Note that one or both of the initial ranging LDPC coded signal and the fine ranging signal includes respective LDPC coded bits and may optionally be preceded by a respective preamble. CMTS 240's processor is configured to process the fine ranging LDPC coded signal to make estimates of the second encoded bits to determine at least one of fine power and timing adjustment for the other communication device.

Figure 3:
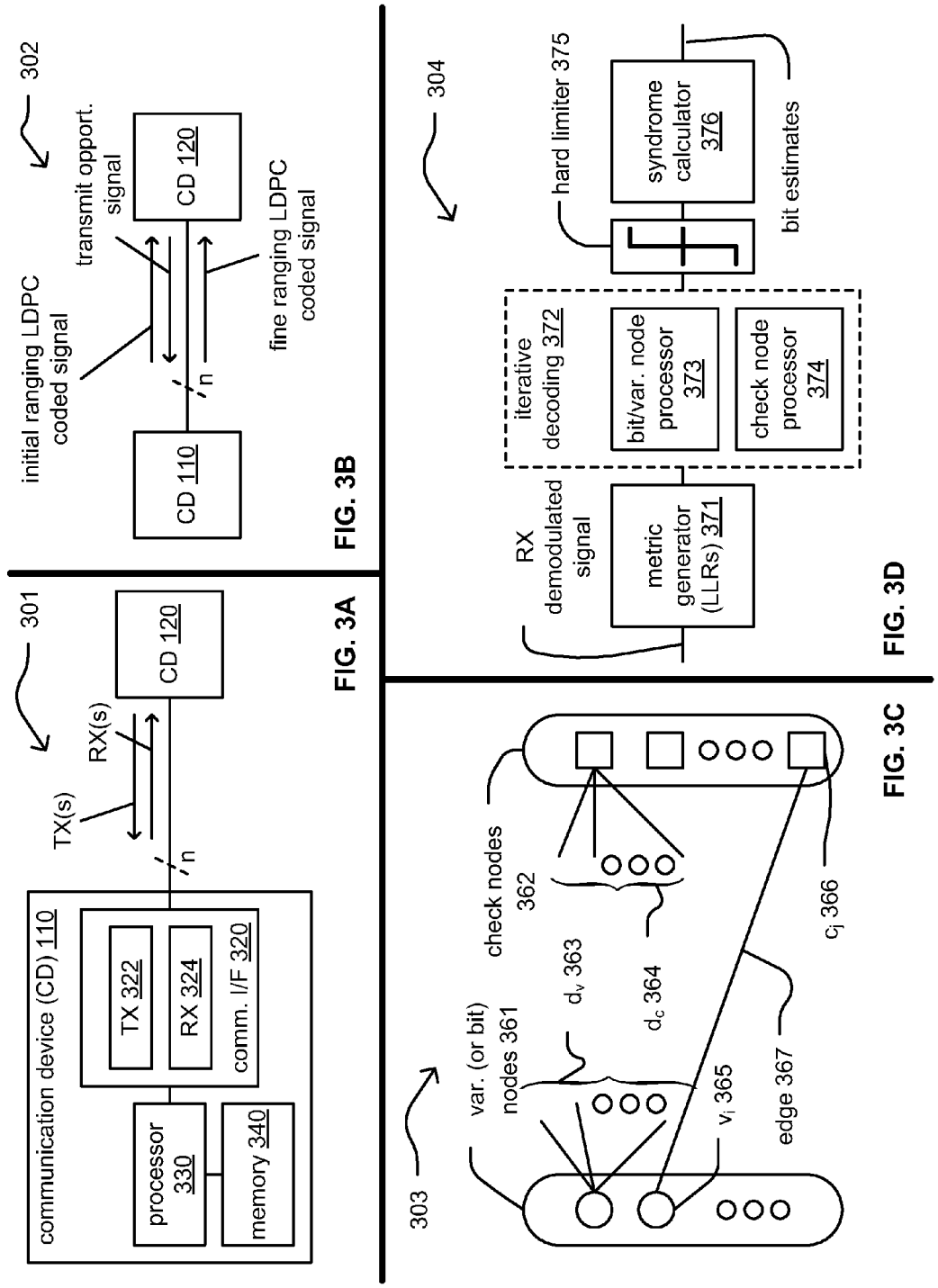
FIG. 3A is a diagram illustrating a communication device operative within one or more communication systems.
FIG. 3B is a diagram illustrating an example of operation of a communication device within one or more communication systems.
FIG. 3C illustrates an example of an LDPC (Low Density Parity Check) code bipartite graph.
FIG. 3D illustrates an example of decoding of an LDPC coded signal.

FIG. 3A is a diagram 301 illustrating a communication device (CD) 110 operative within one or more communication systems. The device 110 includes a communication interface 320 and a processor 330. The communication interface 320 includes functionality of a transmitter 322 and a receiver 324 to support communications with one or more other devices within a communication system. The device 110 may also include memory 340 to store information including one or more signals generated by the device 110 or such information received from other devices (e.g., device 120) via one or more communication channels. Memory 340 may also include and store various operational instructions for use by the processor 330 in regards to the processing of ranging related signals and generation of ranging related signals including those described herein.

The communication interface 320 is configured to support communications to and from one or more other devices. Memory 340 may also include and store information related to characteristics associated with generating and processing ranging related signals. Memory 340 may also include information associated with one or more operational parameters for use in supporting communications with device 120.

FIG. 3B is a diagram illustrating an example 302 of operation of a communication device within one or more communication systems. Device 110 is configured to support communications to and from one or more other devices, such as device 120. Device 110 is configured to include processor 330 and communication interface 320. In an example of operation, processor 330 generates an initial ranging LDPC coded signal based on a first LDPC code and then transmits the initial ranging LDPC coded signal to device 120 for coarse power and timing adjustment. Then, processor 330 processes a transmit opportunity signal received from device 120 to identify a transmit opportunity time period. Processor 330 then generates a fine ranging LDPC coded signal based on a second LDPC code and then transmits the fine ranging LDPC coded signal to device 120 within the transmit opportunity time period for use by the device 120 for fine power and timing adjustment.

As also described in more detail with respect to FIG. 5A and FIG. 5B, the first LDPC code is characterized by a first LDPC matrix that includes a first plurality of sub-matrices, and a first right hand side matrix of the first plurality of sub-matrices is lower triangular and includes all-zero-valued sub-matrices except for first CSI sub-matrices located on a main diagonal of the first right hand side matrix and another diagonal that is adjacently located to the left of the main diagonal of the first right hand side matrix. The second LDPC code is characterized by a second LDPC matrix that includes a second plurality of sub-matrices, and a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix.

FIG. 3C illustrates an example 303 of an LDPC (Low Density Parity Check) code bipartite graph. An LDPC bipartite graph is sometimes be referred to as a "Tanner" graph. An LDPC bipartite graph is a pictorial representation of an LDPC matrix of a corresponding LDPC code, and it shows the relationship of non-null elements of the LDPC matrix in terms of performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T = 0, \forall x \in C \quad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph in example 303 by its parity check matrix with left side nodes representing variable of the code bits (or alternatively as the "variable nodes" (or "bit nodes") 361 in a bit-based decoding of LDPC coded signals), and the right side nodes representing check equations (or alternatively as the "check nodes" 362). The bipartite graph (or Tanner graph) of the LDPC code defined by H may be defined by N variable nodes (e.g., N bit nodes) and M check nodes. Every variable node of the N variable nodes 361 has exactly $d_v(i)$ edges. As an example, edge 367 connects the bit node, $v_i$ 365, to one or more of the check nodes (within the M check nodes). The edge 367 is specifically shown as connecting from the bit node, $v_i$ 365, to the check node, $c_j$ 366. This number of $d_v$ edges (shown as $d_v$ 363) may be referred to as the degree of a variable node i. Analogously, a check node of the M check nodes 362 has $d_c(j)$ edges (shown as $d_c$ 364) connecting this node to one or more of the variable nodes (or bit nodes) 361. This number of edges, $d_c$ 364, may be referred to as the degree of the check node j.

An edge 367 between a variable node $v_i$ (or bit node $b_i$) 365 and check node $c_j$ 366 can be defined by e=(i,j). Alternatively, given an edge e=(i,j), the nodes of the edge may alternatively be denoted as by e=(v(e),c(e)) (or e=(b(e),c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $E_c(j)=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 3D illustrates an example 304 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 371 calculates log-likelihood ratios (LLRs) for each bit location within the received bit sequence. These LLRs correspond initially to the bit nodes 361 of the LDPC code and its corresponding LDPC bipartite graph that represents the LDPC matrix used to decode the signal.

In one implementation of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 372). Check node processing or check node updating is performed using the original bit edge messages (e.g., the calculated LLRs) such as by a check node processor 374. A bit/variable node processor 373 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 374 is configured to perform check message updating (based on rows of the LDPC matrix) to generate updated check edge messages, and the bit/variable node processor 373 is configured to perform bit or variable edge message updating (based on columns of the LDPC matrix) as also described with reference to FIG. 3C.

When more than one decoding iteration is performed, these variable node edge messages are then used by the check node processor 374 for subsequent check node processing or check node updating to calculate updated check edge messages. Then, the bit/variable node processor 373 uses the most recently updated check edge messages to perform bit node processing or bit node updating to update the variable node soft information once again.

After a final decoding iteration, which may be determined based on some parameter (e.g., a predetermined number of decoding iterations or when all syndromes of the LDPC code equal zero, as determined by a syndrome calculator 376), the last calculated variable node soft information may undergo hard limiting (e.g., in a slicer or hard limiter 375) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. The device 110 may be implemented to perform encoding and/or decoding of LDPC coded signal using any desired approach or architecture.

Note that the various functional blocks and components depicted in FIG. 3D may be implemented or performed by the processor 330 (and memory 340) of communication device 110. For example, the processor 330 can be implemented to perform such decoding operations and the memory 340 can be implemented to store and perform memory management for the various bit/variable and check edge messages, variable bit/node soft information, extrinsic information, etc. used in the decoding operations.

Figure 4:
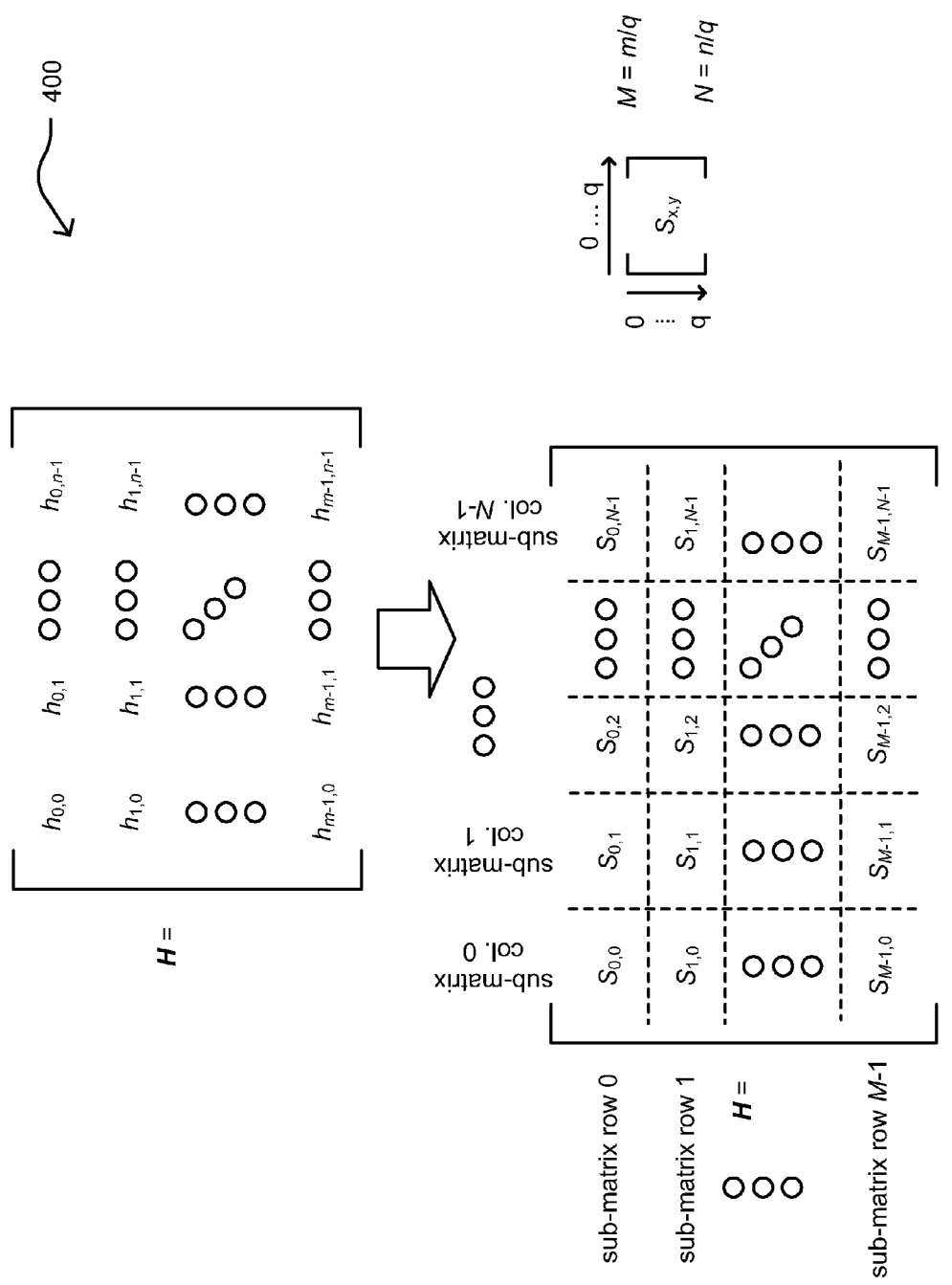
FIG. 4 illustrates an example of an LDPC matrix that is partitioned into sub-matrices.

FIG. 4 illustrates an example 400 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor of a communication device (e.g., processor 330 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 320 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T=0.$$

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j (\bmod q) \\ 0 & \text{otherwise} \end{cases}$$

for any i and j, with $0 \le i \le q$ and $0 \le j \le q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each 0 with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size p(i,j)≥0 (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

FIG. 5A is a diagram illustrating an example 501 of an LDPC matrix partitioned into a left hand side matrix and a right hand side matrix. The parity matrix H of the bottom of FIG. 4 may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Both the left hand side matrix, $H_{LHS}$, and the right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

FIG. 5B is a diagram illustrating some examples 502 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and another diagonal that is adjacently located to the left of the main diagonal. Note that all of the sub-matrices are all-zero-valued sub-matrices (e.g., all elements of such sub-matrices have value of "0") expect the two adjacent diagonals (e.g., the main diagonal and another diagonal that is adjacently located to the left of the main diagonal). Also, note that these sub-matrices on these two adjacent diagonals may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

Various examples have been provided herein showing LDPC decoding that may be performed by processor 330. Processor 330 can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 5A. The right hand side matrix, $H_{RHS}$, can have the form of any of the right hand side matrices of FIG. 5B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 5B, a CSI sub-matrix may be a respective identity matrix that has either not been cyclic shifted (and remains an identity matrix) or a respective identity matrix that has been cyclic shifted by some amount as described above.

Note than any desired LDPC encoding method may be used to generate one or more LDPC codewords using one or more LDPC codes. One possible LDPC encoding method is described below. For sub-matrices of size, L-by-L, input (information) bits, $c_{in}$ (k bits=L(n−m) bits), may be represented as follows:

$$c_{in} = (c_0, c_1, \ldots, c_{k-1})$$

The processor 330 then encodes the input (information) bits and computes L·m parity bits, $C_{par}$ (e.g., LDPC coded bits).

$$c_{par} = (c_k, c_{k+1}, \ldots, c_{Ln-1})$$

The processor 330 then outputs the following:

$$c_P^T = \begin{pmatrix} C_0 \\ C_1 \\ C_2 \\ C_3 \\ C_4 \end{pmatrix}, \text{ where}$$

$$C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 5B being of size 5-by-5 (e.g., where i varies from 0 to 4 in order of 0, 1, 2, 3, 4).

The encoding procedure may be described as follows:
Input: $c_I = (c_0, c_1, \ldots, c_{k-1})$
Step 1: compute $V_i = H_{1,i} c_1^T$, such that i=0, ..., 4.
Step 2: back-substitution $$C_0 = V_0(L - u_{0,0})$$
$$C_1 = V_1(L - u_{1,1}) + C_0((L - u_{1,1} + u_{1,0}) \bmod L)$$
$$C_2 = V_2(L - u_{2,2}) + C_1((L - u_{2,2} + u_{2,1}) \bmod L)$$
$$C_3 = V_3(L - u_{3,3}) + C_2((L - u_{3,3} + u_{3,2}) \bmod L)$$
$$C_4 = V_4(L - u_{4,4}) + C_3((L - u_{4,4} + u_{4,3}) \bmod L)$$

$$\text{Output } c_P^T = \begin{pmatrix} C_0 \\ C_1 \\ C_2 \\ C_3 \\ C_4 \end{pmatrix}$$

FIG. 6A is a diagram illustrating an example 601 of a communication device configured to perform LDPC encoding and puncturing. A bit filler 605 operates to add one or more zero-valued bits to incoming information bits before encoding by forward error correction (FEC) encoder 620. The FEC encoder 620 processes information bits to generate coded bits. In the context of LDPC encoding, encoder 620 employs a generator matrix that is based on a given LDPC code that may also be characterized by a corresponding LDPC matrix. The LDPC matrix can have the characteristics and forms such as described with reference to FIG. 5B such that all sub-matrices of the LDPC matrix are all-zero-valued sub-matrices with the exception of those sub-matrices on the main diagonal and the other diagonal adjacently located that are CSI sub-matrices.

After FEC encoding, a shortener 625 operates to remove those zero-valued bits that were added to the information bit before undergoing FEC encoding. A puncturer 630 punctures one or more subsets of coded bits and one or more subsets of parity bits from the coded bits generated by the FEC encoder 620 and that have undergone shortenening within shortener 625 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

A transmit (TX) driver 690 processes the one or more codewords to generate one or more continuous-time signals for transmission to one or more other devices via one or more communication channels. The TX driver 690 may perform operations such as those of an analog front end (AFE) of a communication device (e.g., digital to analog conversion, filtering, frequency conversion (up or down), gain adjustment and/or scaling, etc.). Generally, the TX driver 690 operates to generate a signal suitable for transmission from the communication device. Note that the operations of the various functional blocks, components, etc. within FIG. 6A may be performed within communication device 110. For example, communication interface 320 of device 110 may be configured to perform the operations of the transmit (TX) driver 690. The processor 330 of device 110 may be configured to perform bit filling, LDPC encoding, shortening, puncturing, and/or other related operations.

FIG. 6B is a diagram illustrating an example 602 of an LDPC matrix that characterizes an LDPC code used to generate an initial LDPC coded signal. The LDPC code matrix construction is based on the sub-matrix based structure described above. The definition of such an (n, k) LDPC code is provided as follows:

(n−k)-by-n parity check matrix H

H is expanded from a binary base matrix $H_b$ of size v-by-u

The base matrix $H_b$ is expanded by replacing each 1 in the base matrix with a size z×z permutation sub-matrix, and each 0 with a size z zero sub-matrix. The permutations used are circular right shifts, and the set of permutation matrices contains the size z identity sub-matrix (e.g., if the element entry is 1) and circular right shifted versions of the identity sub-matrix.

Because each permutation sub-matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix (e.g., a z×z sub-matrix with all elements therein having a value of zero, '0'), and each 1 in $H_b$ is replaced by a circular shift size p(i,j)≥0. The model matrix $H_{bm}$ can then be directly expanded to H. For example, an element of 11 is replaced by a z×z sub-matrix that results from a cyclic shift of 11 from the identity sub-matrix of size z×z. The Mother LDPC code is a rate ½ (160, 80) binary LDPC code. The code has 5×10 base parity check matrix (e.g., 50 sub-matrices) with sub-matrix size (lifting value) equal 16 (e.g., the sub-matrices are each of size 16×16).

FIG. 6C is a diagram illustrating an example 603 of a communication device configured to perform bit filling, LDPC encoding, shortening, and puncturing to generate an initial LDPC coded signal. A processor within a communication device is configured to generate an initial ranging LDPC signal that includes 2 OFDM symbols using quadrature phase shift keying (QPSK). Initially, 56 information bits (e.g., the initial ranging burst) undergo cyclic redundancy check (CRC) processing using 24-bit CRC to generate 80 information bits that are encoded using the forward error correction (FEC) LDPC code (128,80) code to generate 160 coded bits. Using quadrature phase shift keying (QPSK) mode, 2 OFDM symbols are generated. The OFDM symbol size includes 32 sub-carriers. With quadrature phase shift keying (QPSK) modulation, there are 2-bits per sub-carrier and 64 bits per symbol. With binary phase shift keying (BPSK) modulation, there is 1-bit per sub-carrier and 32 bits per symbol. The Mother LDPC code (160,80) code used for Next Codeword Pointer (NCP) and size 128 physical layer (PHY) Link Channel (PLC) FEC code. After generating the coded bits, puncturing is performed on two periods of the (128,80) code: Period 1: size 16 start at 0 (puncturing information bits), and Period 2: size 16 start at 144 (puncturing parity bits). As such, there are 128 bits output as an initial LDPC coded signal.

FIG. 7A is a diagram illustrating an example 701 of a fine ranging signal. The fine ranging (FR) signal may be viewed as a configurable narrow band signal integrated into a data orthogonal frequency division multiple access (OFDMA) frame, that includes one or more of each of cyclic prefix (CP), cyclic suffix (CS), pseudo-random binary sequence (PRBS), and coded information (e.g., coded bits). The FR signal may be transmitted as unicast with no contention. Admission Slots are used similar to the Initial Ranging (IR) signal. Such a FR signal includes a single Admission Slot BPSK pseudo-random binary sequence (PRBS) and coded 34 Bytes of data.

The FR signal includes characteristics various that are configurable by a receiver communication device (e.g., CMTS). The FR signal can be designed to fit into a single frame and includes transmission time shift. The transmit (TX) power and the number of minislots are configurable. A FR signal is also based on a pseudo-random binary sequence (PRBS) sequence, and it includes the number of subcarriers available for the sequence. Referring to the diagram, data includes 34 Bytes, uses Admission Slot structure, and employs quadrature phase shift keying (QPSK) with forward error correction (FEC).

FIG. 7B is a diagram illustrating an example 702 of an LDPC matrix that characterizes an LDPC code used to generate a fine LDPC coded signal. The characteristics of this LDPC matrix may be understood with reference to the definitions and descriptions of FIG. 6A above (e.g., with respect to sub-matrix constructions, cyclic shift indication, etc.). In this example, the Mother LDPC code is a rate (480,288) binary LDPC code. The code has 4×10 base parity check matrix (e.g., 40 sub-matrices).

FIG. 7C is a diagram illustrating an example 703 of a communication device configured to perform bit filling, LDPC encoding, shortening, and puncturing to generate a fine LDPC coded signal. A processor within a communication device is configured to generate a fine ranging LDPC signal. In this example of fine ranging LDPC signal generation, 16 zero-(0)-valued fill bits are added to 272 information bits to generate 288 bits that undergo LDPC encoding based on the rate (480,288) binary LDPC code to generate 480 coded bits. The LDPC code is based on a Mother LDPC (480,288) code used for physical layer (PHY) Link Channel (PLC) FEC code. Then, the 16 zero-(0)-valued fill bits are removed via shortening to generate a bit sequence that undergoes puncturing on two periods using Period 1: size 54 start at 0 (puncturing information bits) and Period 2: size 48 start at 432 (puncturing parity bits). As such, there are 360 bits (144+216 bits) output as a fine LDPC coded signal.

FIG. 8A is a diagram illustrating an example 801 of orthogonal frequency division multiplexing (OFDM) and/or orthogonal frequency division multiple access (OFDMA). OFDM's modulation may be viewed as dividing up an available spectrum into a plurality of narrowband sub-carriers (e.g., relatively lower data rate carriers). The sub-carriers are included within an available frequency spectrum portion or band. This available frequency spectrum is divided into the sub-carriers or tones used for the OFDM or OFDMA symbols and frames. Typically, the frequency responses of these sub-carriers are non-overlapping and orthogonal. Each sub-carrier may be modulated using any of a variety of modulation coding techniques (e.g., as shown by the vertical axis of modulated data).

A communication device may be configured to perform encoding of one or more bits to generate one or more coded bits used to generate the modulation data (or generally, data). For example, a processor of a communication device may be configured to perform forward error correction (FEC) and/or error correction code (ECC) of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, etc. The one or more coded bits may then undergo modulation or symbol mapping to generate modulation symbols. The modulation symbols may include data intended for one or more recipient devices. Note that such modulation symbol may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

FIG. 8B is a diagram illustrating another example 802 of OFDM and/or OFDMA. A transmitting device transmits modulation symbols via the sub-carriers. OFDM and/or OFDMA modulation may operate by performing simultaneous transmission of a large number of narrowband subcarriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a CP (Cyclic Prefix) and/or cyclic suffix (CS) (shown in right hand side of FIG. 8A) that may also be employed within the guard interval to allow switching time, such as when jumping to a new communication channel or sub-channel, and to help maintain orthogonality of the OFDM and/or OFDMA symbols. Generally speaking, an OFDM and/or OFDMA system design is based on the expected delay spread within the communication system (e.g., the expected delay spread of the communication channel). In one example, if an FFT symbol is indexed as [0, . . . , N−1], then the CP may be equal to [N-CP_SIZE:N−1], and CS may be equal to [0 . . . CS_SIZE-1]. In other examples, the CP and/or CS may be generated using other means.

In a single-user system in which one or more OFDM symbols or OFDM frames are transmitted between a transmitter device and a receiver device, all of the sub-carriers or tones are dedicated for use in transmitting modulated data between the transmitter and receiver devices. In a multiple user system in which one or more OFDM symbols or OFDM frames are transmitted between a transmitter device and multiple recipient or receiver devices, the various sub-carriers or tones may be mapped to different respective receiver devices as described below with respect to FIG. 8C.

FIG. 8C is a diagram illustrating another example 803 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of subcarriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignments may be dynamic among different respective transmissions (e.g., a first assignment for a first frame, a second assignment for second frame, etc.). An OFDM frame may include more than one OFDM symbol. Similarly, an OFDMA frame may include more than one OFDMA symbol. In addition, such sub-carrier/tone assignments may be dynamic among different respective symbols within a given frame or superframe (e.g., a first assignment for a first OFDMA symbol within a frame, a second assignment for a second OFDMA symbol within the frame, etc.). Generally speaking, an OFDMA symbol is a particular type of OFDM symbol, and general reference to OFDM symbol herein includes both OFDM and OFDMA symbols (and general reference to OFDM frame herein includes both OFDM and OFDMA frames).

Generally, a communication device may be configured to include a processor configured to process received OFDM or OFDMA symbols and/or frames and to generate such OFDM or OFDMA symbols and/or frames. The processor of the communication device may be configured to generate an OFDMA frame that includes an initial ranging LDPC coded signal. The processor of the communication device may also be configured to generate another OFDMA frame that includes a fine ranging LDPC coded signal. The processor of the communication device may be configured to transmit such OFDMA frames and/or the other OFDMA frames via its communication interface to another communication device.

FIG. 9A is a diagram illustrating an embodiment of a method 901 for execution by one or more communication devices. The method 901 operates by receiving information bits (block 910) and encoding those information bits using a generator matrix of an LDPC code to generate LDPC coded bits (block 920). The LDPC code may be characterized by an LDPC matrix that is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 922).

The method 901 then operates by puncturing a subset of information bits and a subset of parity bits from the LDPC coded bits to generate an LDPC codeword (CW) (block 930). Then, the method 901 operates by transmitting a signal that includes or is based on the LDPC codeword to another communication device via a communication channel (block 940).

FIG. 9B is a diagram illustrating another embodiment of a method 902 for execution by one or more communication devices. The method 902 operates by receiving information bits (block 911) and adding one or more zero-valued bits to the information bits to generate filled information bits (block 913). The method 902 operates by encoding the filled information bits using a generator matrix of an LDPC code to generate LDPC coded bits (block 921). The LDPC code may be characterized by an LDPC matrix that is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 923).

The method 902 then operates by shortening the one or more zero-valued bits from the LDPC coded bits to generate shortened bits (block 925). The method 902 continues by puncturing a subset of information bits in the subset of parity bits from the shortened bits to generate an LDPC codeword (block 931). Then, the method 902 operates by transmitting a signal that includes or is based on the LDPC codeword to another communication device via a communication channel (block 941).

FIG. 10A is a diagram illustrating another embodiment of a method 1001 for execution by one or more communication devices. The method 1001 begins by generating an initial ranging LDPC coded signal based on a first LDPC code (block 1010). In some embodiments, the first LDPC code is characterized by a first LDPC matrix that includes a first plurality of sub-matrices, wherein a first right hand side matrix of the first plurality of sub-matrices is lower triangular and includes all-zero-valued sub-matrices except for first CSI sub-matrices located on a main diagonal of the first right hand side matrix and another diagonal that is adjacently located to the left of the main diagonal of the first right hand side matrix.

Then, the method 1001 continues by transmitting the initial ranging LDPC coded signal to another communication device for use by the other communication device for coarse power and timing adjustment (block 1020). This transmission may be performed via a communication interface of a communication device that executes the method 1001.

The method 1001 then operates by processing a transmit opportunity signal received from the other communication device to identify a transmit opportunity time period indicated therein (block 1030). The method 1001 continues by generating a fine ranging LDPC coded signal based on a second LDPC code. In some embodiments, the second LDPC code is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix (block 1040).

Then, during the transmit opportunity time period, the method 1001 then operates by transmitting the fine ranging LDPC coded signal to the other communication device for use by the other communication device for fine power and timing adjustment (block 1050). This transmission may also be performed via a communication interface of a communication device that executes the method 1001.

FIG. 10B is a diagram illustrating another embodiment of a method 1002 for execution by one or more communication devices. The method 1002 begins by processing an initial LDPC coded signal received from another communication device to determine coarse power and/or timing adjustment for the other communication device (block 1011). This initial LDPC coded signal received may be received via a communication interface of a communication device that executes the method 1002. The method 1002 continues by generating a transmit opportunity signal that indicates 1+ transmit opportunity periods (block 1021).

The method 1002 then operates by transmitting the transmit opportunity signal to the other communication device (e.g., via communication interface) (block 1031). The method 1002 continues by receiving a fine initial LDPC coded signal from the other communication device (e.g., via communication interface) (block 1041). The method 1002 then operates by processing the fine LDPC coded signal received to determine fine power and/or timing adjustment for the other communication device (block 1051).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
a communication interface; and
a processor configured to:
generate an initial ranging low density parity check (LDPC) coded signal based on a first LDPC code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to the left of the main diagonal of the first right hand side matrix;
transmit, via the communication interface, the initial ranging LDPC coded signal to another communication device for use by the other communication device for coarse power and timing adjustment;
receive, via the communication interface, a transmit opportunity signal from the other communication device;
process the transmit opportunity signal to identify a transmit opportunity time period indicated within the transmit opportunity signal;
generate a fine ranging LDPC coded signal based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix; and
transmit, via the communication interface, the fine ranging LDPC coded signal to the other communication device within the transmit opportunity time period for use by the other communication device for fine power and timing adjustment.

2. The communication device of claim 1, wherein the processor is further configured to:

add a first plurality of zero-valued fill bits to first bits to generate first filled bits;
encode the first filled bits using first generator matrix that corresponds to the first LDPC matrix to generate first coded bits;
shorten the first plurality of zero-valued fill bits from the first coded bits;
puncture a first subset of information bits and a first subset of parity bits from the first coded bits to generate a first codeword;
generate the initial ranging LDPC coded signal based on the first codeword;
add a second plurality of zero-valued fill bits to second bits to generate second filled bits;
encode the second filled bits using second generator matrix that corresponds to the second LDPC matrix to generate second coded bits;
shorten the second plurality of zero-valued fill bits from the second coded bits;
puncture a second subset of information bits and a second subset of parity bits from the second coded bits to generate a second codeword; and
generate the fine ranging LDPC coded signal based on the second codeword.

3. The communication device of claim 2, wherein the processor is further configured to:
process first other bits using a 24 bit cyclic redundancy check (CRC) to generate CRC bits; and
generate the first bits based on the CRC bits and the first other bits.

4. The communication device of claim 1, wherein:
the first LDPC matrix includes 40 sub-matrices arranged by 4 sub-matrix rows and 10 sub-matrix columns;
the first right hand side matrix includes 16 sub-matrices of the 40 sub-matrices arranged by 4 sub-matrix rows and 4 sub-matrix columns;
the second LDPC matrix includes 50 sub-matrices arranged by 5 sub-matrix rows and 10 sub-matrix columns; and
the second right hand side matrix includes 25 sub-matrices of the 50 sub-matrices arranged by 5 sub-matrix rows and 5 sub-matrix columns.

5. The communication device of claim 1, wherein the processor is further configured to:
generate another fine ranging LDPC coded signal or a wideband probe signal based on the second LDPC code; and
transmit, via the communication interface, the other fine ranging LDPC coded signal or the wideband probe signal to the other communication device for use by the other communication device for at least one of pre-equalization configuration and refined power and timing adjustment.

6. The communication device of claim 1, wherein the processor is further configured to:
generate an orthogonal frequency division multiple access (OFDMA) frame that includes the initial ranging LDPC coded signal or the fine ranging LDPC coded signal; and
transmit, via the communication interface, the OFDMA frame to the other communication device.

7. The communication device of claim 1 further comprising:
a cable modem, wherein the other communication device includes a cable headend transmitter or a cable modem termination system (CMTS).

8. The communication device of claim 1 further comprising:
the communication interface configured to support communications within at least one of a satellite communication system, a wireless communication system, a wired communication system, a fiber-optic communication system, or a mobile communication system.

9. A communication device comprising:
a communication interface; and
a processor configured to:
receive, via the communication interface, an initial ranging low density parity check (LDPC) coded signal from another communication device, wherein the initial ranging LDPC coded signal includes first encoded bits based on a first LDPC code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to the left of the main diagonal of the first right hand side matrix;
process the initial ranging LDPC coded signal to make estimates of the first encoded bits to determine at least one of coarse power and timing adjustment for the other communication device;
generate a transmit opportunity signal that indicates one or more transmit opportunity time periods including for use by the other communication device to transmit a fine ranging LDPC coded signal;
transmit, via the communication interface, the transmit opportunity signal to the other communication device;
receive, via the communication interface, a fine ranging LDPC coded signal from the other communication device within one of the one or more transmit opportunity time periods, wherein the fine ranging LDPC coded signal includes second encoded bits based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix; and
process the fine ranging LDPC coded signal to make estimates of the second encoded bits to determine at least one of fine power and timing adjustment for the other communication device.

10. The communication device of claim 9, wherein:
the first LDPC matrix includes 40 sub-matrices arranged by 4 sub-matrix rows and 10 sub-matrix columns;
the first right hand side matrix includes 16 sub-matrices of the 40 sub-matrices arranged by 4 sub-matrix rows and 4 sub-matrix columns;
the second LDPC matrix includes 50 sub-matrices arranged by 5 sub-matrix rows and 10 sub-matrix columns; and
the second right hand side matrix includes 25 sub-matrices of the 50 sub-matrices arranged by 5 sub-matrix rows and 5 sub-matrix columns.

11. The communication device of claim 9, wherein the processor is further configured to:
receive, via the communication interface, another fine ranging LDPC coded signal or a wideband probe signal from the other communication device; and
process the other fine ranging LDPC coded signal or the wideband probe signal to determine at least one of pre-equalization configuration and refined power and timing adjustment for the other communication device.

12. The communication device of claim 9 further comprising:
a cable headend transmitter or a cable modem termination system (CMTS), wherein the other communication device i& includes a cable modem.

13. The communication device of claim 9 further comprising:
the communication interface configured to support communications within at least one of a satellite communication system, a wireless communication system, a wired communication system, a fiber-optic communication system, and or a mobile communication system.

14. A method for execution by a communication device, the method comprising:
generating an initial ranging low density parity check (LDPC) coded signal based on a first LDPC code that is characterized by a first LDPC matrix that includes a first plurality of sub-matrices, wherein a first right hand side matrix of the first plurality of sub-matrices is lower triangular and includes all-zero-valued sub-matrices except for first CSI (Cyclic Shifted Identity) sub-matrices located on a main diagonal of the first right hand side matrix and another diagonal that is adjacently located to the left of the main diagonal of the first right hand side matrix;
via a communication interface of the communication device, transmitting the initial ranging LDPC coded signal to another communication device for use by the other communication device for coarse power and timing adjustment;
processing a transmit opportunity signal received from the other communication device to identify a transmit opportunity time period indicated therein;
generating a fine ranging LDPC coded signal based on a second LDPC code that is characterized by a second LDPC matrix that includes a second plurality of sub-matrices, wherein a second right hand side matrix of the second plurality of sub-matrices is lower triangular and includes all-zero-valued sub-matrices except for second CSI sub-matrices located on a main diagonal of the second right hand side matrix and another diagonal that is adjacently located to the left of the main diagonal of the second right hand side matrix; and
during the transmit opportunity time period, transmitting the fine ranging LDPC coded signal to the other communication device for use by the other communication device for fine power and timing adjustment.

15. The method of claim 14 further comprising:
adding a first plurality of zero-valued fill bits to first bits to generate first filled bits;
encoding the first filled bits using first generator matrix that corresponds to the first LDPC matrix to generate first coded bits;
shortening the first plurality of zero-valued fill bits from the first coded bits;
puncturing a first subset of information bits and a first subset of parity bits from the first coded bits to generate a first codeword;
generating the initial ranging LDPC coded signal based on the first codeword;
adding a second plurality of zero-valued fill bits to second bits to generate second filled bits;
encoding the second filled bits using second generator matrix that corresponds to the second LDPC matrix to generate second coded bits;
shortening the second plurality of zero-valued fill bits from the second coded bits;
puncturing a second subset of information bits and a second subset of parity bits from the second coded bits to generate a second codeword; and
generating the fine ranging LDPC coded signal based on the second codeword.

16. The method of claim 15 further comprising:
processing first other bits using a 24 bit cyclic redundancy check (CRC) to generate CRC bits; and
generating the first bits based on the CRC bits and the first other bits.

17. The method of claim 14, wherein:
the first LDPC matrix includes 40 sub-matrices arranged by 4 sub-matrix rows and 10 sub-matrix columns;
the first right hand side matrix includes 16 sub-matrices of the 40 sub-matrices arranged by 4 sub-matrix rows and 4 sub-matrix columns;
the second LDPC matrix includes 50 sub-matrices arranged by 5 sub-matrix rows and 10 sub-matrix columns; and
the second right hand side matrix includes 25 sub-matrices of the 50 sub-matrices arranged by 5 sub-matrix rows and 5 sub-matrix columns.

18. The method of claim 14 further comprising:
generating another fine ranging LDPC coded signal or a wideband probe signal based on the second LDPC code; and
via the communication interface of the communication device, transmitting the other fine ranging LDPC coded signal or the wideband probe signal to the other communication device for use by the other communication device for at least one of pre-equalization configuration and refined power and timing adjustment.

19. The method of claim 14, wherein the communication device includes a cable modem, and the other communication device include a cable headend transmitter or a cable modem termination system (CMTS).

20. The method of claim 14 further comprising:
operating the communication interface of the communication device to support communications within at least one of a satellite communication system, a wireless communication system, a wired communication system, a fiber-optic communication system, or a mobile communication system.

* * * * *